(12) United States Patent
Gris

(10) Patent No.: US 6,352,907 B1
(45) Date of Patent: Mar. 5, 2002

(54) METHOD FOR MANUFACTURING BIPOLAR DEVICES WITH A SELF-ALIGNED BASE-EMITTER JUNCTION

(75) Inventor: Yvon Gris, Tullins (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/580,239

(22) Filed: May 26, 2000

(30) Foreign Application Priority Data

May 31, 1999 (FR) .............................. 99 07023

(51) Int. Cl.⁷ .......................................... H10L 21/8222
(52) U.S. Cl. ....................................... 438/438; 438/318
(58) Field of Search ................................ 438/235, 309, 438/312, 320, 340–342, 348, 170, 570; 257/197, 423, 474, 565

(56) References Cited

U.S. PATENT DOCUMENTS

| | | |
|---|---|---|
| 5,008,207 A | 4/1991 | Blouse et al. |
| 5,132,765 A | 7/1992 | Blouse et al. ................. 357/34 |
| 5,137,840 A | 8/1992 | Desilets et al. |
| 5,488,003 A * | 1/1996 | Chambers et al. .......... 438/309 |
| 5,519,710 A * | 5/1996 | Boyd et al. ................. 438/640 |
| 6,028,345 A * | 2/2000 | Jonhson ...................... 257/592 |
| 6,100,151 A * | 8/2000 | Park ............................ 438/318 |

OTHER PUBLICATIONS

French Search Report from French Patent Application 99/07023, filed May 31, 1999.
Riseman J, "Self–Aligned Epitaxial Base Transistor" IBM Technical Disclosure Bulletin, US, IBM Corp. New York, vol. 26, No. 7A, Dec. 1983, pp. 3190–3191.

* cited by examiner

Primary Examiner—David Nelms
Assistant Examiner—Dung A. Le
(74) Attorney, Agent, or Firm—Wolf, Greenfield & Sacks, P.C.; James H. Morris

(57) ABSTRACT

The manufacturing of the emitter-base junction of a bipolar transistor on an active silicon region delimited by an insulator, the assembly being covered with a first insulating layer, including the steps of etching the first insulating layer to expose the active region; etching the active region across a given height; forming very heavily-doped silicon spacers at the internal periphery of the protrusions resulting from the etching of the first insulating layer and from the etching of the active region; depositing by epitaxy a base layer; forming a third insulating spacer at the internal periphery of a protrusion of the base layer corresponding to the first spacer; depositing an emitter layer; and performing a chem-mech polishing, by using the first layer and the third spacer as stops.

23 Claims, 4 Drawing Sheets

METHOD FOR MANUFACTURING BIPOLAR DEVICES WITH A SELF-ALIGNED BASE-EMITTER JUNCTION

BACKGROUND IF THE INVENTION

1. Field of the Invention

The present invention generally relates to the manufacturing of bipolar devices. It applies to the manufacturing of bipolar transistors in pure bipolar technology or in mixed bipolar MOS (BICMOS) technology.

2. Discussion of the Related Art

Manufacturing the base-emitter junctions of bipolar transistors raises different problems. It is in particular desirable to have self-aligned manufacturing processes to reduce the dimensions of the devices.

It is also desirable not to implant the base, which inevitably creates gaussian doping profiles. The base is ideally formed by a doped epitaxial deposition.

It is also desirable to minimize the access resistance to the base (base resistance) and to improve the frequency response of the transistors. For this purpose, it has in particular been provided to use as a base a silicon-germanium layer. However, the use of germanium, although considerably improving the access resistance of a bipolar transistor and the transit time through the base, raises implementation problems. It is difficult to bring this germanium by an implantation into a silicon layer, and such a layer does not withstand high temperatures.

SUMMARY OF THE INVENTION

An object of the present invention thus is to provide a novel method of manufacturing bipolar transistors enabling formation of base-emitter junctions in a self-aligned way.

Another object of the present invention is to provide such a method that reduces or minimizes the base resistance of the transistors.

Another object of the present invention is to provide such a method that is compatible with the use of a silicon-germanium base region.

To achieve these and other objects, the present invention provides a method of manufacturing the emitter-base junction of a bipolar transistor on an active silicon region of a first conductivity type delimited by a trench filled with a field insulation material, the assembly being covered with a first insulating layer. The method includes the steps of etching the first insulating layer to expose the surface of the active region; etching the surface of the active region across a given height; forming first and second very heavily-doped silicon spacers of the second conductivity type at the internal periphery of the abrupt protrusions respectively resulting from the etching of the first insulating layer and from the etching of the active region; depositing by epitaxy a doped base layer of the second conductivity type; forming a third spacer in an insulating material at the internal periphery of a protrusion of the base layer corresponding to the first spacer; depositing a heavily-doped silicon emitter layer of the first conductivity type; and performing a chem-mech polishing, by using the first layer and the third spacer as stops.

According to an embodiment of the present invention, the method includes, for the etching of the active region, the steps of depositing a silicon layer of a predetermined thickness on the first insulating layer; masking and removing the silicon layer and the first insulating layer above the active area; and selectively etching the silicon with detection and etch stop when the first insulating layer is reached.

According to an embodiment of the present invention, the forming of the first and second spacers is followed by an overetching of the active region.

According to an embodiment of the present invention, the first insulating layer is a multilayer formed of a silicon oxide layer and of a silicon nitride layer.

According to an embodiment of the present invention, the first and second spacers are made of doped polysilicon of the second conductivity type.

According to an embodiment of the present invention, at least the first spacer is made of single-crystal silicon.

According to an embodiment of the present invention, the base layer is formed of silicon and germanium.

According to an embodiment of the present invention, the germanium gradient and the gradient of dopant of the first conductivity type in the base layer are such that the maximum germanium concentration and the maximum dopant concentration are respectively close to the interface with the active region and to the interface with the emitter region.

According to an embodiment of the present invention, the third spacer is made of silicon oxide.

The foregoing objects, features and advantages of the present invention, will be discussed in detail in the following non-limiting description of specific embodiments in connection with the accompanying drawings.

DETAILED DESCRIPTION

For clarity, the same elements have been designated by the same references in the different drawings and, further, as usual in the representation of integrated circuits, the various drawings are not to scale.

Figure 1:
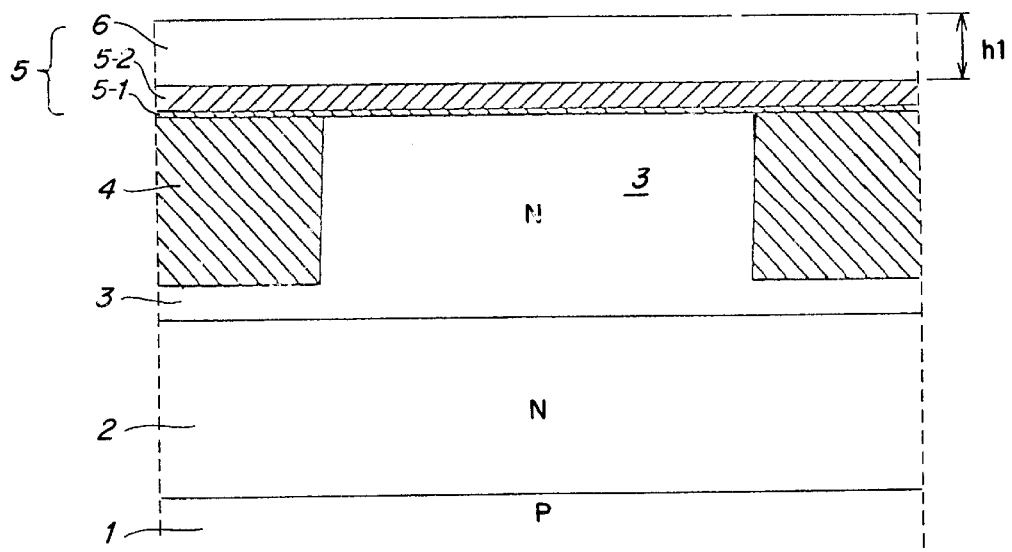
FIGS. 1 to 9 are partial simplified cross-section views of a bipolar transistor at different steps of an example of embodiment of a manufacturing method according to an embodiment of the present invention.

FIG. 1 shows the state of a silicon substrate 1 of a first conductivity type, for example, type P, after initial steps of a method according to an embodiment of the present invention. The substrate includes, on the side of its upper surface, regions 2 and 3 of the second conductivity type, for example, N, respectively heavily and lightly doped. Region 2 results, for example, from an implantatioin/diffusion in substrate 1, and region 3 results from an epitaxial growth. Trenches filled with a field insulating material 4, for example, silicon oxide (SiO2) define active areas in region 3. The assembly is covered with an insulating layer 5. Layer 5 is filled with a silicon layer 6, preferably polysilicon. Thickness h1 of layer 6 is chosen as explained hereafter.

According to an embodiment of the present invention, layer 5 is a multilayer formed of layers of distinct insulating materials selectively etchable with respect to one another and with respect to silicon. This will be, for example, a lower silicon oxide region 5-1 and an upper silicon nitride layer 5-2 (Si3N4).

Figure 2:
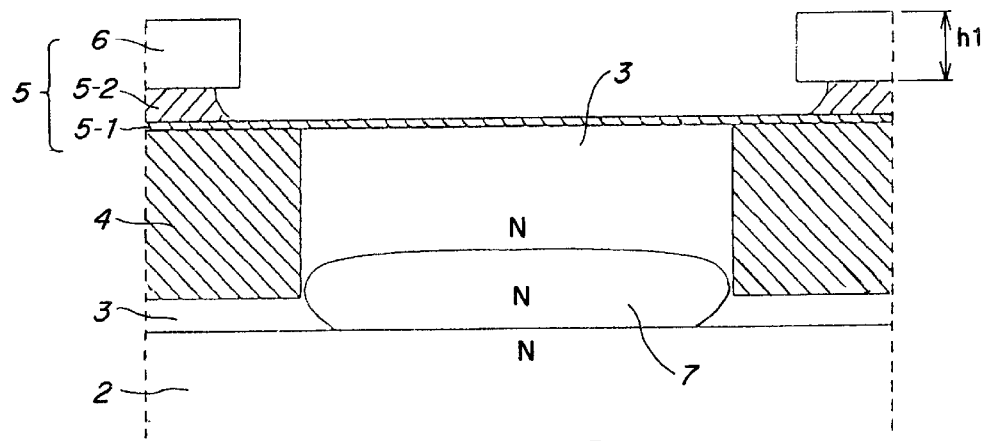

At the next steps, the result of which is illustrated in FIG. 2, layers 6 and 5 are opened by means of the single mask used in this process to expose the active surface of region 3 in which a bipolar transistor is to be formed, by further extending over the peripheral field insulation region. After forming the opening, a high energy implantation may be performed to form at the bottom of region 3, in contact with region 2, a heavily-doped N-type region 7 intended for forming the bottom of the collector of the bipolar transistor. To implant region 7, insulating layer 5-1 is preferably maintained. Layer 5-1 may also be removed, and a thermal oxide may be grown. The forming of an ohmic contact with region 2 is performed conventionally and is neither described, nor shown herein.

Figure 3:
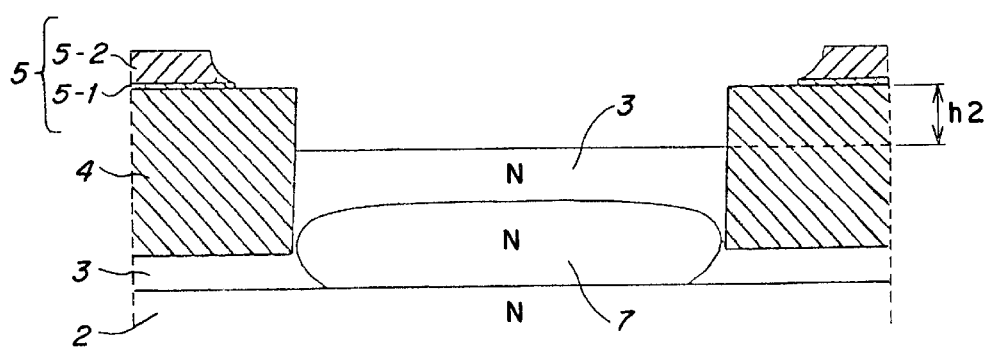

At the next steps, the result of which is illustrated in FIG. 3, silicon oxide layer 5-1 is removed. Then, an anisotropic etching of the silicon is performed. After this, the exposed surface of region 3 at the bottom of the opening is etched at the same time as layer 6. The etching is stopped as soon as layer 6 is completely removed.

An advantage of etching layer 6 at the same time as the surface of region 3 is to have an etch stop layer formed by insulating layer 5, which also provides a detection of the end of the etching. The etch property differences of the materials forming layers 6 and 3 being known, height h1 of layer 6 enables defining height h2 of region 3 that is desired to be removed.

Figure 4:
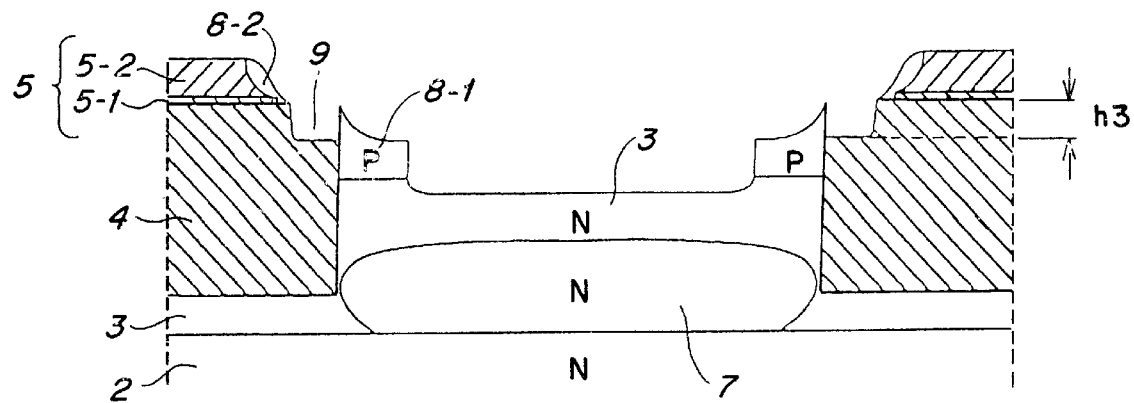

At the next steps, the result of which is illustrated in FIG. 4, a very heavily-doped P-type silicon layer is deposited. The doping is preferably performed in situ. Then, the very heavily-doped layer is anisotropically etched to only leave in place portions 8-1 and 8-2 forming first (8-1) and second (8-2) spacers along the abrupt protrusions respectively formed by field insulation material 4 and insulating layer 5. The width of portion 8-1 is determined by the initial thickness of silicon layer 6.

It should be noted that the forming of portions 8-1 and 8-2 comes along with a voluntary overetch of region 3 of the epitaxial layer. This overetch is performed across a sufficiently large thickness to eliminate a possible parasitic doping resulting from the diffusion of the dopants of portion 8-1 at the surface of region 3, before and possibly after the etching of the heavily-doped layer. The overetching of region 3 is preferably performed to obtain a smooth slope between the exposed surface of region 3 and its contact point with portion 8-1.

Then, field insulation material 4 is etched along a height h3 smaller than the maximum height of portion 8-1. This etching aims at forming a hollowing 9 at the external periphery of portion 8-1. Portion 8-1 is thus partially upraised with respect to the surrounding field insulation material 4.

Figure 5:
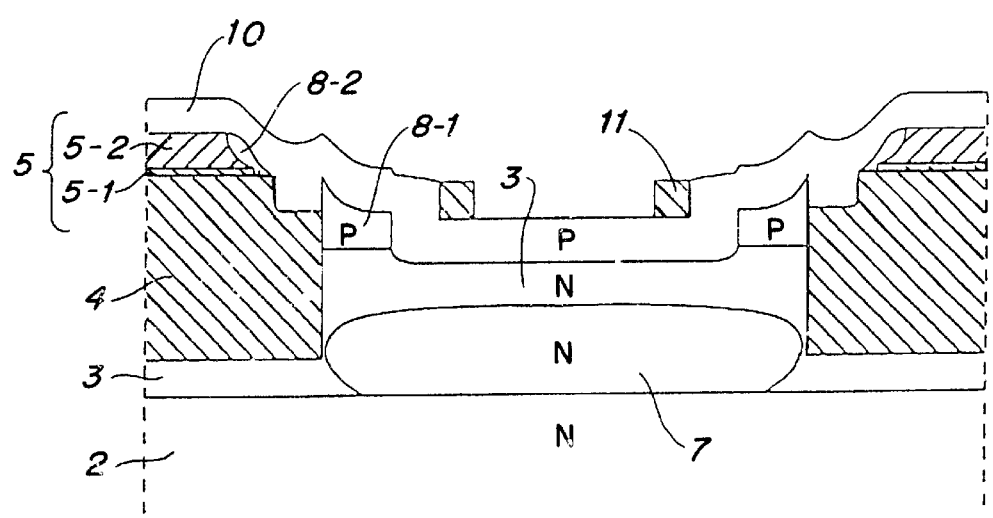

At the next steps, the result of which is illustrated in FIG. 5, a silicon layer 10 is conformally deposited over a thickness at least equal to height h3 of hollowing 9 (FIG. 4). Layer 10 is intended for forming the base of the bipolar transistor and is deposited by epitaxy to be a single-crystal layer at least above region 3. Layer 10 is lightly doped by means of a P-type dopant, for example, boron at a concentration on the order of $5 \times 10^{18}$ atoms/cm$^3$.

Since the deposition of silicon layer 10 is conformal, the upper surface of this layer reproduces the protrusions of the underlying layers and especially the relatively abrupt inner sides of silicon ring 8-1. A ring-shaped third spacer 11 can thus be formed, as shown, by deposition and anisotropic etching of an insulating layer, for example, made of silicon oxide.

Figure 6:
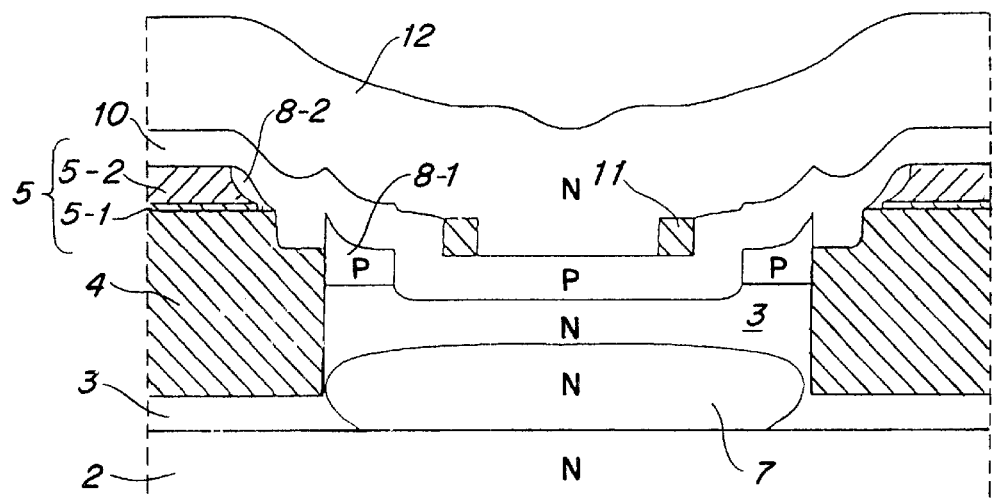

At the next step, the result of which is illustrated in FIG. 6, a polysilicon layer 12, heavily doped, preferably in situ by means of an N-type dopant, is deposited. The dopant will be any known dopant, for example, arsenic or phosphorus. layer 12 is intended for forming the emitter of the bipolar transistor.

Figure 7:
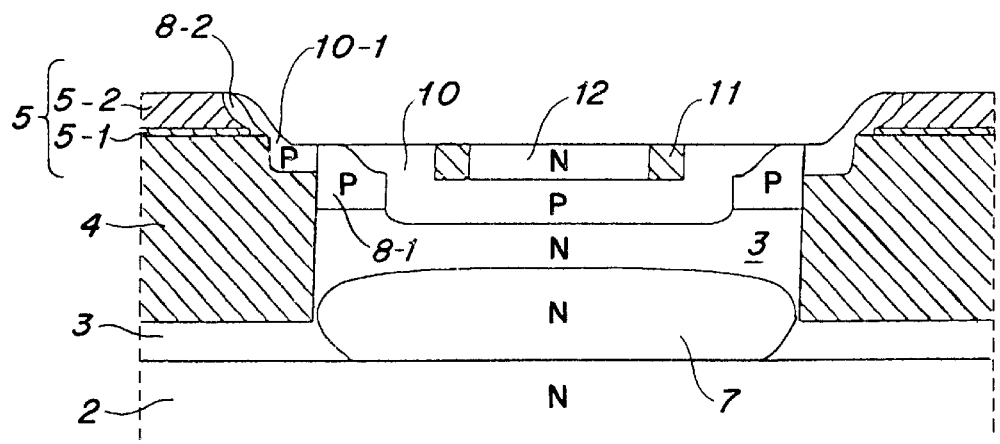

At the next step, the result of which is illustrated in FIG. 7, a chem-mech polishing is performed according to the present invention. This polishing stops when the upper surfaces of layer 5 and of spacer 11 are reached. The obtained planeity improves as the dimensions, at least in one direction, become small, which is always the case in high frequency integrated devices. There then only remains, of N-type silicon layer 12, an emitter portion internal to ring-shaped spacer 11. The P-type silicon layer remains in place in a base central portion. There also remains a peripheral portion 10-1 of layer 10 that ensures a contact between heavily-doped P-type silicon portions 8-1 and 8-2 (in the region corresponding to hollowing 9 of FIG. 4). It should be noted that there is an electric continuity between elements 10, 8-1, 10-1, and 8-2.

Figure 8:
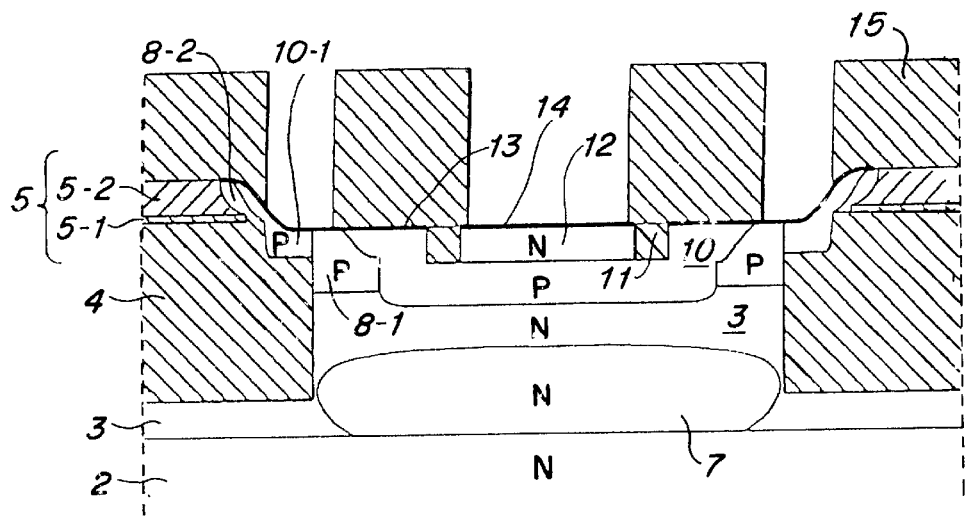

At the next steps, the result of which is illustrated in FIG. 8, a silicidation of the apparent conductive surfaces is performed. A first silicided base contact 13 thus forms on the upper surfaces of the various elements of same first doping type (P) 10, 8-1, 10-1, and 8-2. A significant portion of silicided contact 13 is located above insulating region 4. The base-collector capacitance is thus reduced. A second silicided contact 14 also forms on emitter layer 12. Then, an insulating layer 15, for example, made of silicon oxide, is deposited and opened, to partially expose contacts 13 and 14. It should be noted that, due to the extension of the base contact, as a consequence of the presence of silicide 13 on regions 8-1, 10-1 and 8-2, the positioning of the base contact opening is not critical, which is a remarkable advantage of the present invention.

Figure 9:
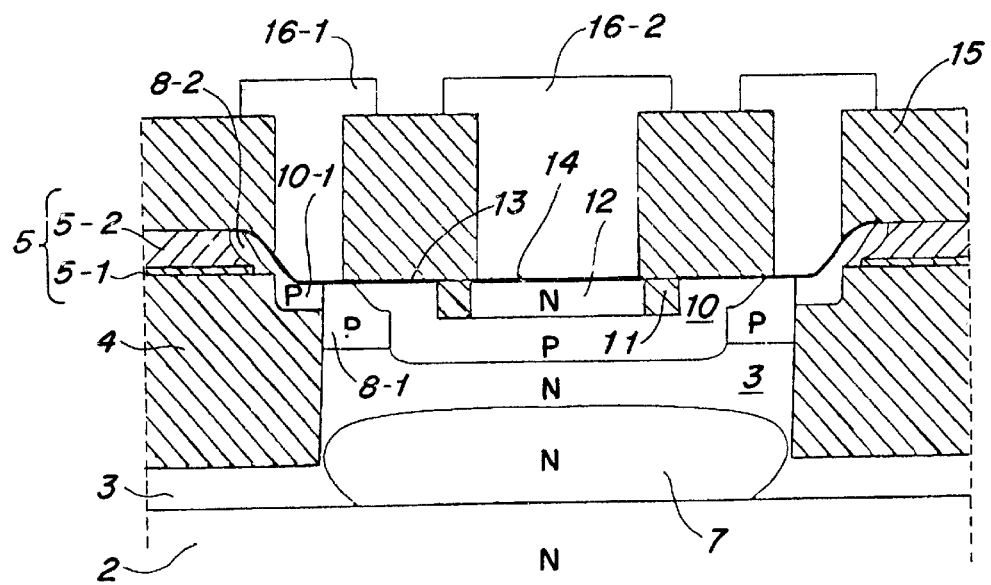

The method ends, as illustrated in FIG. 9, with the filling of the openings of layer 15 by a conductive material 16, for example, a metal, preferably tungsten. Base and emitter contact areas 16-1 and 16-2 are thus respectively formed.

In a subsequent step of the method (not shown), an area of contact recovery with layer 2 will also be formed to form a contacting area for collector 7, outside the shown plane.

The present invention especially applies to the forming of transistors, the base of which is made of silicon-germanium. Indeed, during the step of epitaxial deposition of base layer 10 previously described in relation with FIG. 5, it is possible to provide that a portion at least of the thickness of layer 10 is made of a germanium-silicon alloy, according to a chosen concentration profile. The concentration profiles of germanium and of the dopant, for example boron, inserted in layer 10, are preferably such that their maximum concentration peaks inside layer 10 are distinct and that that of germanium is closer to base-substrate junction 3-10 than that of boron.

An advantage of the method according to the present invention is to enable a base contact on a very heavily-doped silicon element, which is easier to silicide than a layer including germanium (layer 10). It should be noted that, since the doping of portions 8-1 and 8-2 is very high, a significant diffusion occurs into the neighboring elements, and especially into portion 10-1 ensuring a contact between said portions.

In an embodiment of the present invention, the characteristics of the various layers and etchings will be the following:

region 2:
   thickness: from 1 to 3 µm, preferably 2 µm;
   doping: $2 \times 10^{19}$ at./cm$^3$ of arsenic;
region 3 (formed by epitaxy):
   thickness: from 0.5 to 1 µm;
   doping : $1 \times 10^{16}$ at./cm$^3$ of arsenic;
multilayer 5:
   layer 5-1 made of silicon oxide, of a thickness from 2 to 20 nm, preferably on the order of 5 nm;

layer 5-2 made of silicon nitride, of a thickness from 40 to 100 nm, preferably on the order of 55 nm;

thickness h1 (FIGS. 1 and 2) of layer 6 of definition of the etch stop of region 3: from 100 to 250 nm, preferably on the order of 150 nm;

height h2 of region 3 (FIG. 3): on the same order as thickness h1;

portions 8-1 and 8-2: doping $1 \times 10^{20}$ at./cm$^3$ of boron;

overetching of the surface of region 3 (FIG. 4): substantially equal to height h1;

height h3 of hollowing 9 (FIG. 4): included between 30 and 100 nm, preferably on the order of 60 nm;

base germanium-silicon layer 10:
 thickness included between 30 and 150 nm, preferably on the order of 60 nm (greater thickness in the presence of Ge);

polysilicon emitter layer 12:
 doping: from $10^{20}$ to $2 \times 10^{21}$ at./cm$^3$ of arsenic or phosphorus;
 thickness in the active window before polishing (FIG. 6): from 100 to 250 nm, preferably on the order of 150 nm;
 thickness in the active window after polishing (FIG. 7): from 80 to 200 nm, preferably on the order of 100 nm;

silicon oxide layer 15, of a thickness included between 300 and 2000 nm, preferably on the order of 800 nm; and contact-metallization material 16-1, 16-2: tungsten or aluminum or an alloy of these metals with a Ti/TiN barrier layer between the metal and the silicide; the metallizations bearing on layer 15 may be formed of a material distinct from a material of filling the openings of this same layer 15.

Of course, the present invention is likely to have various alterations, modifications, and improvements which will readily occur to those skilled in the art. In particular, the principles of the present invention have been described and illustrated as applied to the forming of an NPN-type bipolar transistor. I lowever, those skilled in the art should understand that a PNP-type transistor could be formed according to the same principles, by complementarily doping the different silicon regions, layer, or portions 1, 2,3,7, 8-1, 8-2, 10, and 12.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an emitter-base junction of a bipolar transistor on an active silicon region of a first conductivity type delimited by a trench filled with a field insulation material, the active silicon region being covered with a first insulating layer, including the steps of:
 etching the first insulating layer to expose a surface of the active silicon region;
 etching the surface of the active silicon region down to a given height;
 forming first and second very heavily-doped silicon spacers of a second conductivity type at an internal periphery of abrupt protrusions respectively resulting from the etching of the first insulating layer and from the etching of the active region;
 growing by epitaxy a doped base layer of the second conductivity type;
 forming a third spacer of an insulating material at an internal periphery of a protrusion of the doped base layer corresponding to the first spacer;
 depositing a heavily-doped silicon emitter layer of the first conductivity type; and
 performing a chem-mech polishing, using the first insulating layer and the third spacer as stops.

2. The method of claim 1, including, for the etching of the active region, the steps of:
 depositing a silicon layer of a predetermined thickness on the first insulating layer;
 masking and removing the silicon layer and the first insulating layer above the active silicon region; and
 selectively etching the silicon with detection and etch stop when the first insulating layer is reached.

3. The method of claim 1, wherein forming of the first and second spacers is followed by an overetching of the active region.

4. The method of claim 1, wherein the first insulating layer is a multilayer formed of a silicon oxide layer and of a silicon nitride layer.

5. The method of claim 1, wherein the first and second spacers are made of doped polysilicon of the second conductivity type.

6. The method of claim 1, wherein at least the first spacer is made of singlecrystal silicon.

7. The method of claim 1, wherein the base layer is formed of silicon and germanium.

8. The method of claim 7, wherein a germanium gradient and a gradient of dopant of the first conductivity type in the doped base layer are such that a maximum germanium concentration and a maximum dopant concentration are respectively close to an interface with the active silicon region and to the interface with an emitter region.

9. The method of claim 1, wherein the third spacer is made of silicon oxide.

10. A method for manufacturing an emitter-base junction of a bipolar transistor, the bipolar transistor being formed in an active region of a silicon substrate of a first conductivity type and covered by an insulating layer and a polysilicon layer, the method comprising acts of:
 removing the insulating layer to expose a surface of the active region;
 removing the surface of the active region by an amount substantially equal to an initial thickness of the polysilicon layer;
 forming a first heavily-doped silicon spacer of a second conductivity type along an edge formed by the removal of the active region;
 forming a second heavily-doped silicon spacer of the second conductivity type along edge formed by the removal of the insulating layer;
 forming a doped base layer of the second conductivity type;
 forming a third ring-shaped spacer along a protrusion in the doped base layer, the protrusion corresponding to an inner edge of the first spacer;
 forming a heavily-doped emitter layer of the first conductivity type interior to the third ring-shaped spacer; and
 planarizing a surface of the bipolar transistor using upper surfaces of the insulating layer and the third spacer as stops.

11. The method of claim 10, wherein the step of removing the insulating layer includes removing a silicon oxide layer and removing a silicon nitride layer.

12. The method of claim 10, wherein the steps of forming the first and second heavily-doped silicon spacers include forming first and second doped polysilicon spacers of the second conductivity type.

13. The method of claim 10, wherein the step of forming the first heavily-doped silicon spacer includes forming a first heavily-doped single-crystal silicon spacer.

14. The method of claim 10, wherein the step of forming the doped base layer includes a step of depositing a silicon-germanium layer to form at least a portion of the base layer.

15. A bipolar transistor having an emitter-base junction, the bipolar transistor being formed in an active region of a first conductivity type delimited by a trench filled with a field insulation material and covered by a first insulating layer, comprising:

- a heavily-doped collector region of the first conductivity type formed at a bottom of the active region;
- a first heavily-doped silicon spacer of a second conductivity type formed along an inner periphery of the first insulating layer;
- a second heavily-doped silicon spacer of the second conductivity type formed on the active region;
- a base layer of the second conductivity type formed on the active region, adjacent the second spacer;
- a ring-shaped third spacer formed on the base layer; and
- an emitter portion of the first conductivity type formed interior to the ring-shaped third spacer;

wherein a portion of material of the second conductivity type is formed between the first and second spacers to ensure contact between the first and second spacers.

16. The bipolar transistor of claim 15, further comprising a silicide base layer formed on an upper surface of the first and second spacers and of the portion of material of the second conductivity type located between the first and second spacers.

17. The bipolar transistor of claim 16, further comprising:

- a second insulating layer formed over the silicide layer, the second insulating layer defining openings; and
- a conductive material formed in the openings of the second insulating layer to provide base and emitter contacts.

18. The bipolar transistor of claim 15, wherein the base layer includes a silicongermanium layer.

19. The bipolar transistor of claim 18, wherein the silicon-germanium layer has a concentration profile such that a maximum concentration of germanium is located closer to a junction between the base layer and the active region than is a maximum concentration of dopant.

20. The bipolar transistor of claim 19, wherein the dopant is Boron.

21. The bipolar transistor of claim 15, wherein the first insulating layer is a multilayer including a silicon oxide layer and a silicon nitride layer.

22. The bipolar transistor of claim 15, wherein the first and heavily-doped silicon spacers are formed of doped polysilicon of the second conductivity type.

23. The bipolar transistor of claim 15, wherein at least the first heavily-doped silicon spacer is formed of a single-crystal silicon.

* * * * *